(12) United States Patent
Ishihara et al.

(10) Patent No.: US 11,646,155 B2
(45) Date of Patent: May 9, 2023

(54) ELECTRODE-EQUIPPED PASSIVE COMPONENT AND COLLECTIVE BODY OF ELECTRODE-EQUIPPED PASSIVE COMPONENTS

(71) Applicant: Murata Manufacturing Co., Ltd., Kyoto-fu (JP)

(72) Inventors: Takehito Ishihara, Nagaokakyo (JP); Tatsuya Funaki, Nagaokakyo (JP); Haruhiko Ikeda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 217 days.

(21) Appl. No.: 17/344,666

(22) Filed: Jun. 10, 2021

(65) Prior Publication Data

US 2021/0304963 A1 Sep. 30, 2021

Related U.S. Application Data

(63) Continuation of application No. PCT/JP2020/039716, filed on Oct. 22, 2020.

(30) Foreign Application Priority Data

Jan. 29, 2020 (JP) .............................. JP2020-012685

(51) Int. Cl.
*H01G 4/005* (2006.01)
*H01G 4/224* (2006.01)

(52) U.S. Cl.
CPC ............. *H01G 4/005* (2013.01); *H01G 4/224* (2013.01)

(58) Field of Classification Search
CPC .............................. H01G 4/005; H01G 4/224
See application file for complete search history.

(56) References Cited

U.S. PATENT DOCUMENTS

| 2003/0096453 A1* | 5/2003 | Wang .................... H01L 21/563 257/E21.511 |
| 2004/0209403 A1 | 10/2004 | Gotoh et al. |
| 2009/0166897 A1* | 7/2009 | Katsurayama .......... H01L 24/27 257/793 |

(Continued)

FOREIGN PATENT DOCUMENTS

| JP | 2002-145380 A | 5/2002 |
| JP | 2004-207483 A | 7/2004 |

(Continued)

OTHER PUBLICATIONS

International Search Report issued in PCT/JP2020/039716; dated Dec. 22, 2020.

*Primary Examiner* — Nathan Milakovich
(74) *Attorney, Agent, or Firm* — Studebaker & Brackett PC (57) ABSTRACT

An electrode-equipped passive component is an electrode-equipped passive component to be mounted on a mount target, and includes a passive component main body, an electrode provided on a mount surface of the passive component main body, and an underfill layer provided on the mount surface of the passive component main body. The underfill layer includes a thermosetting resin, a flux, and a solvent, and has a surface having a skin layer. The skin layer has tack power equal to or smaller than 25 mN/mm$^2$ at room temperature and equal to or larger than 60 mN/mm$^2$ at 40° C.

16 Claims, 5 Drawing Sheets

(56) References Cited

U.S. PATENT DOCUMENTS

| | | |
|---|---|---|
| 2014/0242757 A1 | 8/2014 | Yoko et al. |
| 2018/0043478 A1* | 2/2018 | Alvarez .................. H01L 24/81 |

FOREIGN PATENT DOCUMENTS

| | | | |
|---|---|---|---|
| JP | 2006-521703 A | | 9/2006 |
| JP | 2007-281393 A | | 10/2007 |
| JP | 2012-074636 A | | 4/2012 |
| JP | 2012-146830 A | | 8/2012 |
| JP | 2012-238699 A | | 12/2012 |
| JP | 2012-238702 A | | 12/2012 |
| JP | 2013-127999 A | | 6/2013 |
| JP | 2015-503220 A | | 1/2015 |
| JP | 2017-045993 A | | 3/2017 |
| JP | 2019-054082 A | | 4/2019 |
| KR | 20090105488 A | * | 10/2009 |

\* cited by examiner

ELECTRODE-EQUIPPED PASSIVE COMPONENT AND COLLECTIVE BODY OF ELECTRODE-EQUIPPED PASSIVE COMPONENTS

CROSS-REFERENCE TO RELATED APPLICATIONS

This application claims benefit of priority to International Patent Application No. PCT/JP2020/039716, filed Oct. 22, 2020, and to Japanese Patent Application No. 2020-012685, filed Jan. 29, 2020, the entire contents of each are incorporated herein by reference.

BACKGROUND

Technical Field

The present disclosure relates to an electrode-equipped passive component and a collective body of electrode-equipped passive components.

Background Art

When solder-bump-equipped semiconductor component is mounted on a substrate, die bonding (a method of simultaneously performing contact pressurization and heating) is often used.

In Japanese Unexamined Patent Application Publication (Translation of PCT Application) No. 2015-503220, there is described that a laminated adhesive-layer-equipped wafer is acquired on a surface of a wafer having solder bumps, this wafer is subjected to dicing to acquire adhesive-layer-equipped semiconductor chips, the solder bumps of the semiconductor chips and electrodes of wiring boards are aligned, and heating, pressure bonding, and jointing are performed.

The adhesive for use in Japanese Unexamined Patent Application Publication (Translation of PCT Application) No. 2015-503220 is a B-staged composite, which is taken as causing adhesiveness to act by heating, pressure bonding, and jointing. Thus, it is thought that only mounting at room temperature does not cause adhesiveness to act. Thus, simultaneously with alignment of the semiconductor chips and the substrate, heating, pressure bonding, and jointing are performed for each semiconductor chip.

SUMMARY

A mode of mounting a passive component such as a capacitor on a mount target such as a substrate or an electronic component is an electrode-equipped passive component. The electrode-equipped passive component has an electrode provided on a mount surface of a passive component main body which functions as a passive component.

In the following, it is assumed in the specification that the passive component means an electrode-equipped passive component, unless otherwise specified.

Since the number of passive components to be mounted on the mount target is large, if the passive components are heated, pressure-bonded, and mounted one by one, a problem occurs in view of assembly productivity. Thus, it is preferable that many passive components are arranged on the mount target and subjected to reflow, thereby being mounted on the mount target.

Before reflow is performed, the passive component and the mount target are aligned. However, there are problems in which, before the passive component is fixedly attached to the mount target by reflow, the passive component and the mount target are misaligned or the passive component is rotated or inverted.

To avoid this, it is thought to provide an underfill layer as an adhesive layer on the mount surface of the passive component main body.

Here, when the underfill layer is provided on the mount surface of the passive component main body, the underfill layer is a surface in contact with a pickup nozzle. Thus, if the adhesive power of the underfill layer is strong, there is a problem in which the components of the underfill layer are attached to the pickup nozzle when the passive component is picked up. Thus, at the time of pickup, it is preferable that the underfill layer has no adhesive power or weak adhesive power.

On the other hand, when the passive component and the mount target are aligned, the adhesive power of the underfill layer is preferably caused to act to make the passive component and the mount target adhered to each other.

The present disclosure thus provides an electrode-equipped passive component including an underfill layer which has poor adhesive power at the time of pickup and thus less causes residues of the underfill layer on the pickup nozzle to occur, and is capable of making adhesive power when aligned with a mount target to such an extent that the passive component is not misaligned during reflow.

An electrode-equipped passive component according to the present disclosure is an electrode-equipped passive component to be mounted on a mount target, and includes a passive component main body, an electrode provided on a mount surface of the passive component main body, and an underfill layer provided on the mount surface of the passive component main body. The underfill layer includes a thermosetting resin, a flux, and a solvent, and has a surface having a skin layer. The skin layer has tack power equal to or smaller than 25 mN/mm$^2$ at room temperature and equal to or larger than 60 mN/mm$^2$ at 40° C.

A collective body of electrode-equipped passive components according to the present disclosure includes a ring frame, a carrier tape laminated to the ring frame, and a plurality of the electrode-equipped passive components according to the present disclosure collectively laminated so that the underfill layer is oriented to a surface opposite to the carrier tape.

According to the present disclosure, it is possible to provide an electrode-equipped passive component including an underfill layer which has poor adhesive power at the time of pickup and thus less causes residues of the underfill layer on the pickup nozzle to occur and is capable of making adhesive power when aligned with a mount target to such an extent that the passive component is not misaligned during reflow.

DETAILED DESCRIPTION

In the following, an electrode-equipped passive component and a collective body of electrode-equipped passive components of the present disclosure are described.

However, the present disclosure is not limited to the following structures and can be applied as modified as appropriate in a range not modifying the gist of the present disclosure. Note that the present disclosure is also directed to a combination of two or more preferred structures of the respective embodiments of the present disclosure described below.

An electrode-equipped passive component of the present disclosure is an electrode-equipped passive component to be mounted on a mount target, and includes a passive component main body, an electrode provided on a mount surface of the passive component main body, and an underfill layer provided on the mount surface of the passive component main body. The underfill layer includes a thermosetting resin, a flux, and a solvent, and has a surface having a skin layer. The skin layer has tack power equal to or smaller than 25 mN/mm$^2$ at room temperature and equal to or larger than 60 mN/mm$^2$ at 40° C.

Figure 1:
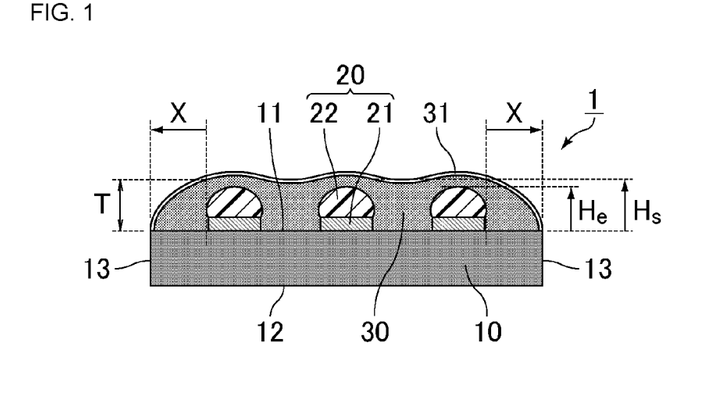
FIG. 1 is a sectional view schematically depicting one example of an electrode-equipped passive component.

FIG. 1 is a sectional view schematically depicting one example of an electrode-equipped passive component.

An electrode-equipped passive component 1 includes a passive component main body 10 including a mount surface 11 and a surface 12 opposite to the mount surface, an electrode 20 provided on the mount surface 11 of the passive component main body, and an underfill layer 30 provided on the mount surface 11 of the passive component main body.

The electrode 20 includes a land 21 provided on the mount surface 11 of the passive component main body and a bump 22 provided on the land 21.

The underfill layer 30 is provided on the mount surface 11 of the passive component main body, covering the bump 22 of the electrode 20. The underfill layer 30 has a surface having a skin layer 31.

Examples of the passive component include a capacitor, an inductor, an LC composite component, a resistor, a vibrator, a filter, and so forth.

The passive component may be a thin-film passive component with a capacitor or the like formed on a semiconductor substrate or the like by thin-film process. Also, it may be a thin-film passive component with a capacitor and an inductor integrally formed on a semiconductor substrate or the like.

Examples of the semiconductor substrate include a silicon (Si) substrate, a gallium arsenide (GaAs) substrate, a silicon germanium (SiGe) substrate, and so forth.

Also, the passive component may be a chip component of a multilayer ceramic capacitor, a multilayer ceramic inductor, or the like.

The electrode-equipped passive component exemplarily depicted in FIG. 1 is a thin-film passive component.

In the following, a case is described in which the passive component is a thin-film passive component. A case in which the passive component is a chip component will be described further below by using other drawings.

The mount surface of the passive component main body is a surface where the passive component is opposed to the mount target. The mount surface of the passive component main body is provided with an electrode.

When the passive component is a thin-film electronic component, the electrode is preferably formed of a land provided on the mount surface of the passive component main body and a bump provided on the land.

The number of electrodes to be provided to the mount surface of the passive component main body is not particularly limited, and may be one or plural equal to or more than two. Also, when a plurality of electrodes are provided to the mount surface of the passive component main body, the arrangement of the electrodes is not particularly limited, and they may be provided in a lattice shape over the entire mount surface of the passive component main body, may be provided on the periphery of the mount surface of the passive component main body, or may be provided at the center of the mount surface of the passive component main body.

The land is an electrode pattern formed on the mount surface of the passive component main body, and its material is preferably gold (Au), silver (Ag), copper (Cu), palladium (Pd), nickel (Ni), titanium (Ti), aluminum (Al), an alloy containing at least one type of these metal, or the like.

Also, the land may have a structure with any of these metal provided with a plated layer. Examples of the structure of the plated layer include a Ni layer, Au layer, Sn layer, Ag layer, a layer formed of an alloy containing at least one type of these metals, and so forth.

The size of the land and the shape of the land are not particularly limited.

When the passive component is a thin-film electronic component, the land may be an electrode pattern provided on a semiconductor substrate.

As the bump, a solder bump can be suitably used. The composition of the solder bump is not particularly limited, and is preferably a composition mountable by reflow.

As for the height of the bump, since it is required to absorb a level difference from the mount target at the time of soldering, the height is required to be equal to or larger than a certain extent. However, if the height of the bump is too high, bump overflow and a short to an adjacent electrode due to excessive supply are feared. Thus, it is preferable that the height of the bump is, for example, 5 μm or higher and 30 μm or lower (i.e., from 5 μm to 30 μm).

Also, it is preferable that the height of the electrode from the mount surface of the passive component main body (a total of the land thickness and the bump thickness) is 7 μm or higher (the land thickness is 2 μm at minimum) and 45 μm or lower (the land thickness is 15 μm at maximum) (i.e., from 7 μm (the land thickness is 2 μm at minimum) to 45 μm (the land thickness is 15 μm at maximum)).

In FIG. 1, the height of the electrode from the mount surface of the passive component main body (hereinafter also simply referred to as the height of the electrode) is indicated by an arrow He.

The underfill layer is a layer formed of a composite capable of causing adhesive power between the passive component and the mount target to act to such an extent that the passive component and the mount target are not misaligned when the passive component is mounted on the mount target by reflow.

The underfill layer has a surface having a skin layer. The skin layer is a film formed with the composite configuring the underfill layer being dried, and the composite configuring the skin layer is identical to the composite configuring the underfill layer.

The underfill layer includes a thermosetting resin, a flux, and a solvent to cause adhesive power to act.

As the thermosetting resin, an epoxy resin, phenol resin, amino resin, unsaturated polyester resin, acrylic resin, silicone resin, or the like can be used.

Examples of the epoxy resin include a bisphenol-A-type epoxy resin, bisphenol-F-type epoxy resin, novolac-type epoxy resin, and so forth. These epoxy resins are also phenol resins. Also, examples of other epoxy resins include a glycidyl-amine-type epoxy resin and so forth.

Examples of the acrylic resin include polymethyl methacrylate and so forth.

Examples of the silicone resin include polymethyl siloxane and so forth.

Examples of components that may be included in the flux include inorganic acid, inorganic salt, saturated fatty acid, unsaturated fatty acid, hydroxy acid, aromatic carboxylic acid, and dicarboxylic acid.

Examples of inorganic acid include phosphoric acid, hydrochloric acid, hydrofluoric acid, hydrobromic acid, fluoroboric acid, and so forth.

Examples of inorganic salt include zinc chloride, tin chloride, ammonium chloride, ammonium fluoride, sodium fluoride, and so forth.

Examples of saturated fatty acid include formic acid, acetic acid, lauric acid, stearic acid, and so forth.

Examples of unsaturated fatty acid include oleic acid, abietic acid, and so forth.

Examples of hydroxy acid include lactic acid, malic acid, and so forth.

Examples of aromatic carboxylic acid include benzoic acid and so forth.

Examples of dicarboxylic acid include oxalic acid, succinic acid, glutaric acid, adipic acid, maleic acid, glutamic acid, and so forth.

As a solvent, an alcohol-based solvent, ether-based solvent, glycol-based solvent, ester-based solvent, or the like can be used.

Examples of the alcohol-based solvent include benzyl alcohol, α-terpineol, cyclohexanedimethanol, and so forth.

Examples of a solvent that is an alcohol-based solvent and is also an ether-based solvent (also referred to as an alcohol-ether-based solvent) include 2-terpinyloxy ethanol, 2-dihydroterpinyloxy ethanol, 1-(2-butoxy-1-methylethoxy)propan-2-ol, and so forth.

Examples of a solvent that is an ether-based solvent and also is a glycol-based solvent (also referred to as a glycol-ether-based solvent) include ethylene glycol benzyl ether, diethylene glycol butyl ether, diethylene glycol hexyl ether, diethylene glycol ethyl hexyl ether, propylene glycol phenyl ether, and so forth.

Examples of the glycol-based solvent include hexylene glycol and so forth.

Examples of the ester-based solvent include diisobutyl adipate and so forth.

Among these components, as the composite configuring the underfill layer, a composite, in which the thermosetting resin is a bisphenol-A-type epoxy resin, the flux contains an adipic acid, and the solvent is 1-(2-butoxy-1-methylethoxy) propan-2-ol, is preferable.

In this case, the composite preferably has 20 wt % or more and 30 wt % or less (i.e., from 20 wt % to 30 wt %) of bisphenol-A-type epoxy resin and 10 wt % or more and 20 wt % or less (i.e., from 10 wt % to 20 wt %) of adipic acid.

As a ratio of each component in the underfill layer, it is preferred that the thermosetting resin is equal to or larger than 20 wt % and equal to or smaller than 30 wt % (i.e., from 20 wt % to 30 wt %), the flux is equal to or larger than 10 wt % and equal to or smaller than 20 wt % (i.e., from 10 wt % to 20 wt %), and the solvent is equal to or larger than 15 wt % and equal to or smaller than 25 wt % (i.e., from 15 wt % to 25 wt %).

The skin layer, which is present on the surface of the underfill layer, has tack power equal to or smaller than 25 $mN/mm^2$ at room temperature and equal to or larger than 60 $mN/mm^2$ at 40° C.

That the tack power of the skin layer is equal to or smaller than 25 $mN/mm^2$ at room temperature means that the adhesiveness of the skin layer is poor at room temperature. Since the passive component is picked up normally at room temperature, if adhesiveness is poor at room temperature, the components of the skin layer (the components of the underfill layer) are prevented from being attached to the pickup nozzle when the skin layer makes contact with the pickup nozzle. In this case, "stringiness", in which the skin layer attached to the pickup nozzle is pulled by the pickup nozzle to become extended, is prevented. Note that "room temperature" in the specification when the tack power is measured means 20° C.

Also, the tack power of the skin layer may be equal to or larger than 10 $mN/mm^2$ at room temperature.

That the tack power of the skin layer is equal to or larger than 60 $mN/mm^2$ at 40° C. means that the adhesive power of the skin layer becomes high at 40° C. When the picked-up passive component is mounted on the mount target, the temperature of the stage where the mount target is to be placed is set in advance at 40° C. or so, and the skin layer is opposed to the mount target heated at 40° C. or so and the passive component is aligned with and adhered to the mount target. When the skin layer has tack power equal to or larger than 60 $mN/mm^2$ at 40° C., the passive component and the mount target can be adhered to each other to such an extent that the position of the passive component does not move on the mount target.

Also, the tack power of the skin layer may be equal to or smaller than 150 $mN/mm^2$ at 40° C.

The tack power of the skin layer can be measured by using a tackiness tester and, for example, can be measured by using TAC1000 manufactured by RHESCA Co., Ltd.

The height of the skin layer from the mount surface of the passive component main body (hereinafter also simply referred to as the height of the skin layer) is high at an area below which an electrode is present and is low between a plurality of electrodes.

FIG. 1 depicts a state in which the height of the skin layer 31 is not constant, and the height of the skin layer 31 is low between the plurality of electrodes 20. By taking the mount surface 11 of the electronic component main body as a starting point, the height of the skin layer 31 at a portion where the height of the skin layer 31 is low is indicated by an arrow Hs.

The shape of the skin layer is such as this because the underfill layer sinks between the electrodes.

On the other hand, the height of the electrode 20 by taking the mount surface 11 of the electronic component main body as a starting point is indicated by the arrow He.

Thus defined height (Hs) of the skin layer between the plurality of electrodes is preferably higher than the height (He) of the electrode.

With the above-described relation, at the time of mounting the passive component on the mount target, the skin layer reliably makes contact with the electrode of the mount target. Thus, in particular, misalignment at the stage of positioning before reflow less tends to occur.

Also, the height of the skin layer can be said also as the thickness of the underfill layer. It is preferable that thus defined thickness of the underfill layer is 15 μm or larger and 35 μm or smaller (i.e., from 15 μm to 35 μm).

Note that the value of the thickness of the underfill layer is equal to the value of the height of the skin layer (the dimension indicated by the arrow Hs).

The thickness of the underfill layer is preferably thin in an outer peripheral region of the underfill layer.

FIG. 1 depicts a mode in which the thickness of the underfill layer 30 is thinner toward an end face 13 of the passive component main body 10 in the outer peripheral region of the underfill layer.

The outer peripheral region of the underfill layer is a region further outside the electrode positioned at the outermost side portion on the mount surface of the passive component main body, and is a region indicated by an arrow X in FIG. 1. Note that the region indicated by the arrow X does not include a region where the electrode positioned at the outermost side portion on the mount surface of the passive component main body is formed.

That the thickness of the underfill layer is thin in the outer peripheral region of the underfill layer means that the thickness of the underfill layer in the outer peripheral region of the underfill layer is thin with respect to the thickness of the underfill layer in an outer side portion of an end portion of the electrode positioned at the outermost side portion on the mount surface of the passive component main body (thickness indicated by a double-headed arrow T in FIG. 1).

If there is no portion in which the thickness of the underfill layer in the outer peripheral region of the underfill layer exceeds the thickness of the underfill layer in an outer side portion of the end portion of the electrode positioned at the outermost side portion on the mount surface of the passive component main body, it is defined that the thickness of the underfill layer is thin in the outer peripheral region of the underfill layer.

The thickness of the underfill layer in the outer peripheral region of the underfill layer is preferably thinner toward the end face of the passive component main body, and is preferably the thinnest at the end face of the passive component main body.

With the thickness of the underfill layer being thin in the outer peripheral region of the underfill layer, a fillet formed of the underfill layer occurring when the passive component is mounted is prevented from spreading too much. Thus, a plurality of passive components can be narrowly and adjacently mounted on the mount target.

Also, from the result that the thickness of the underfill layer is thin in the outer peripheral region of the underfill layer, the height of the underfill layer in the outer peripheral region of the underfill layer is preferably lower than the height of the electrode. This means that the height of the underfill layer is lower than the height of the electrode at the midpoint between "an outer side portion of the end portion of the electrode positioned at the outermost side portion on the mount surface of the passive component main body" and "the end face of the passive component main body". With the height of the underfill layer being as described above, it is possible to decrease the amount of the underfill layer extending outside from the end face of the passive component main body after the passive component is mounted.

The end face of the passive component main body preferably has a modified layer formed by laser. The end face of the passive component main body is positioned as indicated by a reference numeral 13 in FIG. 1.

While a method of manufacturing an electrode-equipped passive component will be described further below, dicing is performed in that process. When dicing using laser is performed as a method for separation into pieces, a layer modified by laser (laser-modified layer) is formed on the end face of the passive component main body.

With the laser-modified layer being present on the end face of the passive component main body, the underfill layer can nicely spread out over the end face of the passive component main body when the passive component is mounted, and therefore this is preferable.

Next, one example of a method of acquiring the electrode-equipped passive component of the present disclosure is described.

FIG. 2A, FIG. 2B, FIG. 2C, and FIG. 2D are process charts schematically depicting part of processes for acquiring the electrode-equipped passive component.

First, a semiconductor substrate in which a portion which functions as a passive component such as a capacitor is formed by thin-film process is prepared.

Figure 2A:
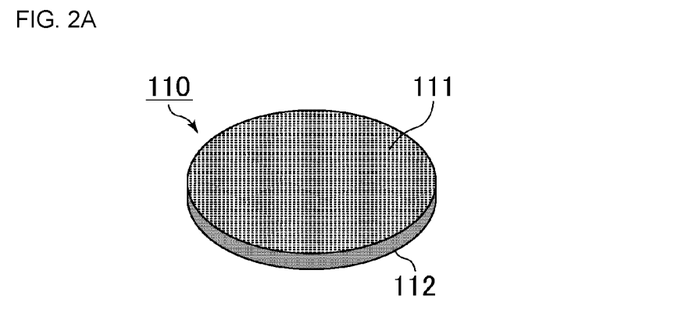
FIG. 2A, FIG. 2B, FIG. 2C, and FIG. 2D are process charts schematically depicting part of processes for acquiring the electrode-equipped passive component.

A first principal surface 111 of a semiconductor substrate 110 depicted in FIG. 2A is a pattern formation surface, in which many capacitors are formed by thin-film process and electrodes (lands and bumps formed on the lands) of the passive components are exposed.

A second principal surface 112 of the semiconductor substrate 110 is a back surface.

Figure 2B:
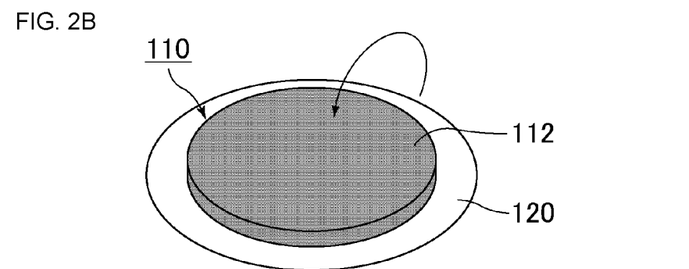

Subsequently, as depicted in FIG. 2B, the first principal surface 111 of the semiconductor substrate 110 is laminated to a back grind tape 120. The semiconductor substrate 110 laminated to the back grind tape 120 has its second principal surface 112 exposed to the top.

Figure 2C:
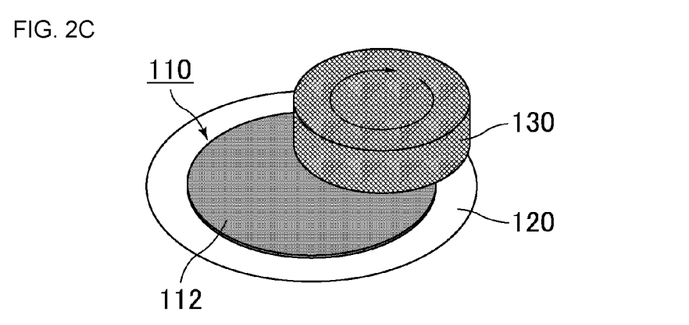

Then, as depicted in FIG. 2C, a grindstone 130 is placed onto the second principal surface 112 of the semiconductor substrate 110 to grind the back surface side of the semiconductor substrate 110, thereby decreasing the thickness of the semiconductor substrate 110.

Figure 2D:
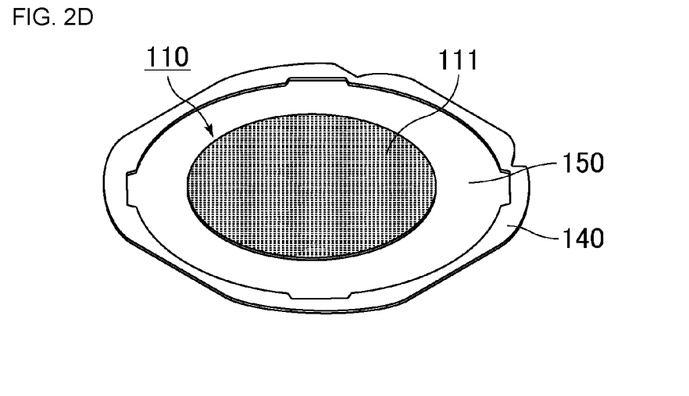

Subsequently, by using a tape mounter or the like, as depicted in FIG. 2D, the back surface (ground surface) of the semiconductor substrate 110 is laminated to a carrier tape 150 in a ring frame 140. The semiconductor substrate 110 laminated to the carrier tape 150 and having its back surface ground has its first principal surface 111 exposed to the top.

The ring frame and the carrier tape to be used herein are later subjected to dicing process, and are thus also called a dicing frame and a dicing tape, respectively.

FIG. 3A, FIG. 3B, FIG. 3C, and FIG. 3D are process charts schematically depicting part of processes for acquiring the electrode-equipped passive component.

Figure 3A:
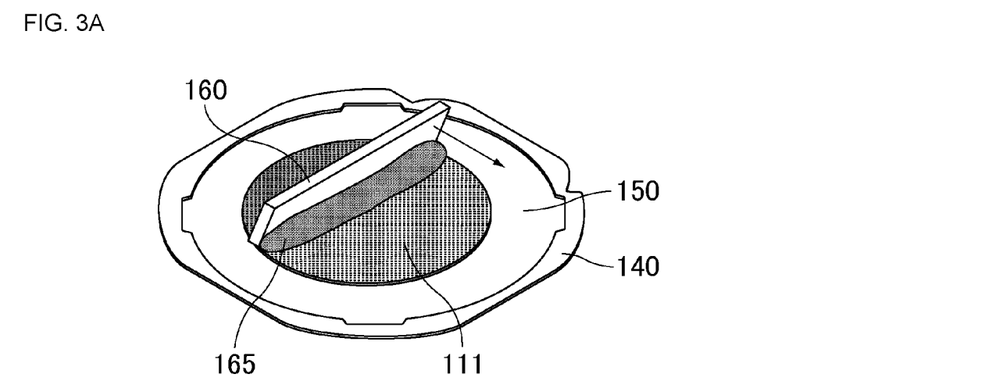
FIG. 3A, FIG. 3B, FIG. 3C, and FIG. 3D are process charts schematically depicting part of processes for acquiring the electrode-equipped passive component.

As depicted in FIG. 3A, the first principal surface 111 of the semiconductor substrate 110 is coated with a composite 165 for underfill layer formation serving as an underfill layer by using a coater 160 or the like.

In FIG. 3A, a moving direction of the coater 160 is indicated by an arrow.

The composite for underfill layer formation includes a thermosetting resin, a flux, and a solvent configuring the above-described underfill layer.

Subsequently, a drying process is performed, removing unwanted solvent components included in the composite for underfill layer formation. In this process, a skin layer is formed on a surface of the underfill layer.

Figure 3B:
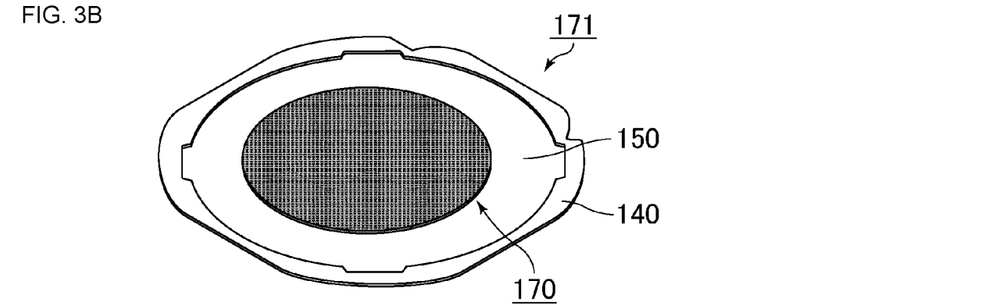

With the above-described processes, as depicted in FIG. 3B, a collective body 171 of electrode-equipped passive components is acquired, the collective body 171 including an underfill-layer-equipped semiconductor substrate 170 which is laminated to the carrier tape 150 laminated to the ring frame 140 so that the underfill layer is oriented to a surface opposite to the carrier tape 150.

The underfill-layer-equipped semiconductor substrate 170 has a plurality of electrode-equipped passive components of the present disclosure collected. By separating the underfill-layer-equipped semiconductor substrate 170 into pieces, they become the electrode-equipped passive components of the present disclosure.

Subsequently, dicing is performed on the underfill-layer-equipped semiconductor substrate to separate the underfill-layer-equipped semiconductor substrate into pieces. As a method for dicing, stealth dicing by laser and a method by expansion can be used.

Figure 3C:
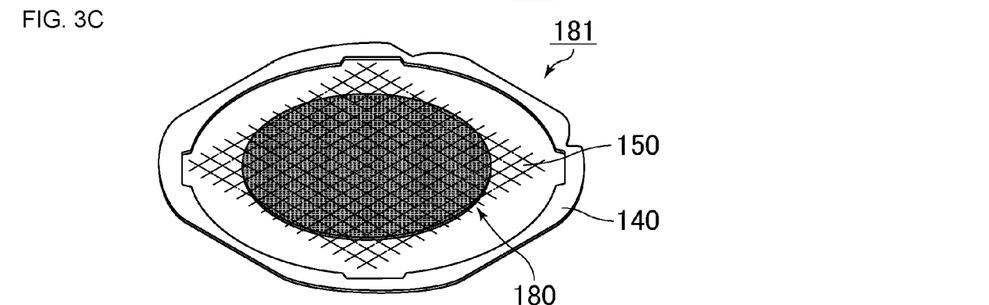

FIG. 3C depicts an underfill-layer-equipped semiconductor substrate 180 subjected to stealth dicing.

By stealth dicing, cracks are formed inside the semiconductor substrate.

Figure 3D:
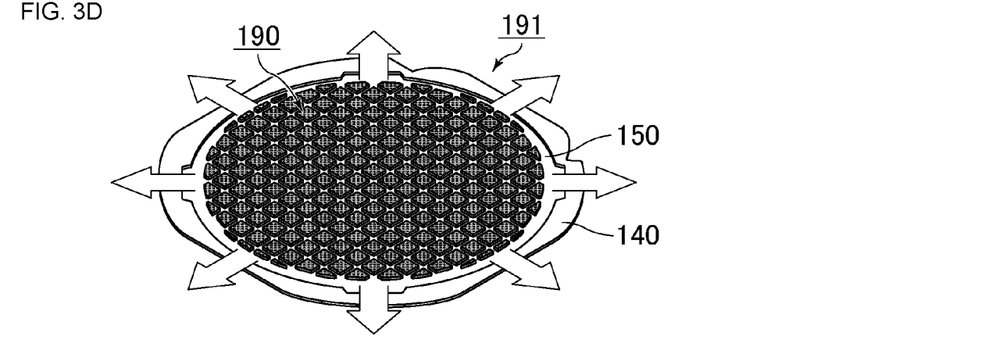

Subsequently, as depicted in FIG. 3D, the carrier tape 150 is expanded. By this process, a plurality of individual electrode-equipped passive components 190 in a state of being laminated to the carrier tape 150 are acquired.

In the processes described so far, the collective body of electrode-equipped passive components of the present disclosure is acquired.

The collective body of electrode-equipped passive components of the present disclosure includes a ring frame, a carrier tape laminated to the ring frame, and a plurality of the electrode-equipped passive components of the present disclosure collectively laminated to the carrier tape so that the underfill layer is oriented upward.

As "a plurality of the electrode-equipped passive components of the present disclosure collectively laminated", they may take a mode of the underfill-layer-equipped semiconductor substrate 170 depicted in FIG. 3B, a mode of the underfill-layer-equipped semiconductor substrate 180 subjected to stealth dicing depicted in FIG. 3C, or may take a mode of the individual electrode-equipped passive components 190 depicted in FIG. 3D.

That is, each of the collective body 171 of the electrode-equipped passive components including the underfill-layer-equipped semiconductor substrate 170 depicted in FIG. 3B, a collective body 181 of the electrode-equipped passive components including the underfill-layer-equipped semiconductor substrate 180 subjected to stealth dicing depicted in FIG. 3C, and a collective body 191 of the electrode-equipped passive components including the plurality of individual electrode-equipped passive components 190 depicted in FIG. 3D is a mode of the collective body of electrode-equipped passive components of the present disclosure.

The individual electrode-equipped passive components 190 depicted in FIG. 3D each correspond to the electrode-equipped passive component of the present disclosure.

Therefore, by the above-described processes, the electrode-equipped passive component of the present disclosure is acquired.

Note that while a method of expanding after stealth dicing is exemplarily described as a method of dicing an underfill-layer-equipped semiconductor substrate, the method of dicing is not limited to the above-described method and may be wet blade dicing.

However, since wet blade dicing has a disadvantage of swelling of the underfill layer because water is splashed onto the surface of the underfill layer, dicing is preferably performed by stealth dicing.

Next, a method of mounting the electrode-equipped passive component on a mount target is described.

FIG. 4A, FIG. 4B, FIG. 4C, and FIG. 4D are process charts schematically depicting part of processes for mounting the electrode-equipped passive component on a mount target.

Figure 4A:
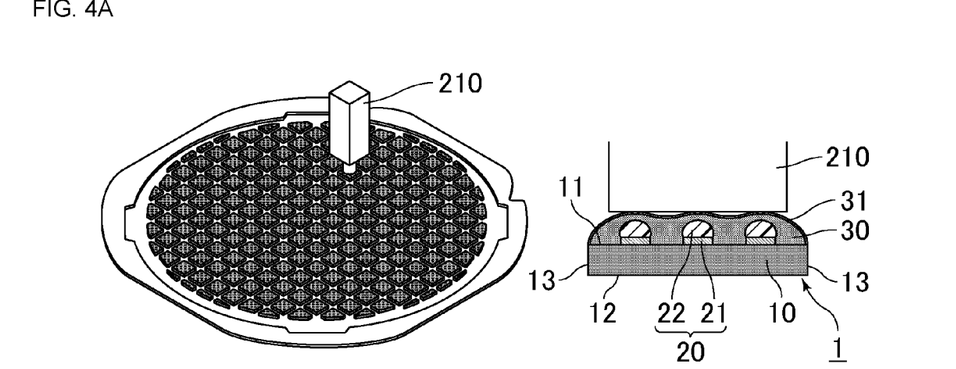
FIG. 4A, FIG. 4B, FIG. 4C, and FIG. 4D are process charts schematically depicting part of processes for mounting the electrode-equipped passive component on a mount target.

FIG. 4A depicts a process of picking up the electrode-equipped passive component 1 by using a pickup nozzle 210. A general view of the process is depicted on the left side in FIG. 4A, and an enlarged sectional view is depicted on the right side in FIG. 4A.

The pickup nozzle 210 makes contact with the skin layer 31 on the surface of the underfill layer 30 of the electrode-equipped passive component 1 and picks up the electrode-equipped passive component 1.

The passive component is picked up at a temperature lower than 40° C., preferably at a temperature equal to or lower than room temperature.

At the temperature equal to or lower than room temperature, the tack power of the skin layer is small, which is equal to or smaller than 25 mN/mm$^2$. Thus, the components of the skin layer (the components of the underfill layer) are prevented from being attached to the pickup nozzle. In this case, "stringiness", in which the skin layer attached to the pickup nozzle is pulled by the pickup nozzle to become extended, is prevented.

Figure 4B:
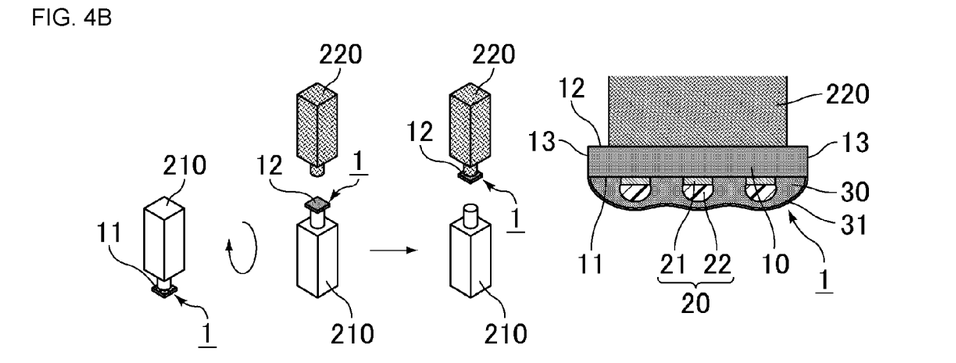

FIG. 4B depicts a process of transferring the electrode-equipped passive component 1 from the pickup nozzle 210 to a mount nozzle 220. A process chart of a process of transferring the electrode-equipped passive component from the pickup nozzle to a mount nozzle is depicted on the left side in FIG. 4B, and an enlarged sectional view after the electrode-equipped passive component is transferred to the mount nozzle is depicted on the right side in FIG. 4B.

Immediately after the electrode-equipped passive component 1 is picked up, the surface 12 opposite to the mount surface of the passive component main body is oriented downward, and thus the pickup nozzle 210 is turned upside down to make the surface 12 opposite to the mount surface of the passive component main body oriented upward. The mount nozzle 220 is brought into contact therewith from above, and the surface 12 opposite to the mount surface of the passive component main body is suctioned to the mount nozzle 220. With this, the mount surface 11 of the passive component main body is exposed as being oriented downward.

Figure 4C:
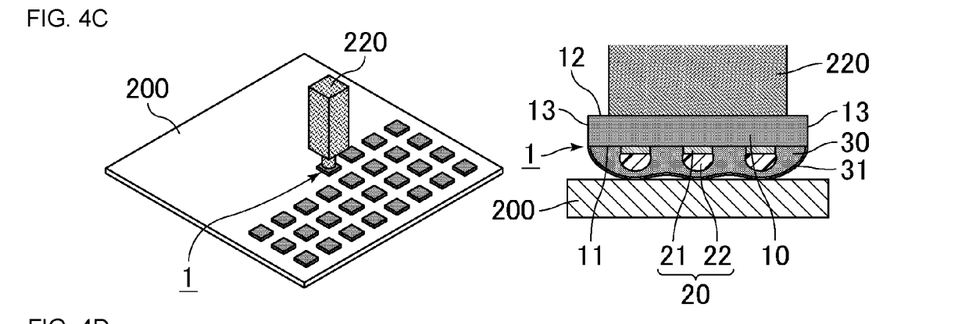
Figure 4D:
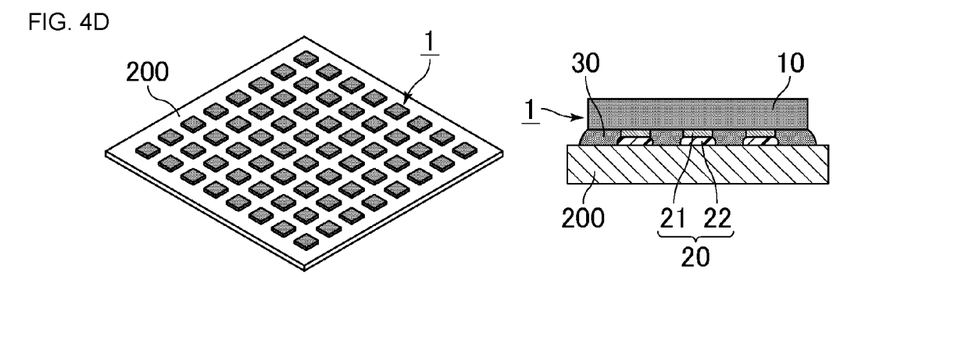

FIG. 4C and FIG. 4D schematically depict part of processes for mounting the passive component on the mount target.

General views of the process are depicted on the left side in FIG. 4C and FIG. 4D, and enlarged sectional views are depicted on the right side in FIG. 4C and FIG. 4D.

As depicted in FIG. 4C, a substrate 200 as a mount target where the electrode-equipped passive component 1 is to be mounted is heated in advance at 40° C. or higher. Note that the temperature for heating is preferably 130° C. or lower.

Heating the substrate is preferably performed by increasing the temperature of a stage where the substrate is placed.

Then, the electrode-equipped passive component 1 is placed on the substrate 200, with the skin layer 31 of the underfill layer 30 opposed to the substrate 200.

Since the tack power of the skin layer is equal to or higher than 60 mN/mm$^2$ at 40° C., if the temperature of the substrate is equal to or higher than 40° C., the passive component and the substrate can be adhered to each other to such an extent that the position of the passive component does not move on the substrate.

FIG. 4D depicts a state in which the electrode-equipped passive component 1 is mounted on the substrate 200 after reflow.

When heating in a reflow furnace is performed, the bump 22 (solder bump) is dissolved to be jointed to the substrate 200, and the electrode-equipped passive component 1 is thereby mounted on the substrate 200.

Also, by heating in the reflow furnace, the thermosetting resin included in the underfill layer 30 is solidified.

It is only required that the reflow temperature is set in accordance with an appropriate heating temperature of a material for use as a bump and, for example, the peak temperature is set equal to or higher than 200° C. and equal to or lower than 260° C. (i.e., from 200° C. to 260° C.).

In consideration of the above, as an electrode-equipped passive component mounting method of mounting the electrode-equipped passive component of the present disclosure on the mount target, the method preferably includes: a process of picking up the electrode-equipped passive component of the present disclosure by bringing the skin layer of the underfill layer into contact with the pickup nozzle at a temperature equal to or lower than room temperature; a process of heating the mount target at 40° C. or higher; a process of placing the electrode-equipped passive component of the present disclosure so that the skin layer of the underfill layer is opposed to the mount target; and a process of reflowing the mount target having the electrode-equipped passive component placed thereon and jointing the electrode of the electrode-equipped passive component to the mount target.

Also, in the above-described electrode-equipped passive component mounting method, the total volume of the underfill layer of the electrode-equipped passive component is preferably larger than a volume acquired by subtracting the volume of the electrode from a space between the mount surface of the passive component main body and the mount target.

With this relation, no gap is formed between the mount surface of the passive component main body and the mount target after reflow, and thus it is possible to enhance reliability of mounting the electrode-equipped passive component.

While the case has been described so far in which the electrode-equipped passive component is a thin-film passive component, the electrode-equipped passive component may be a chip component.

Figure 5:
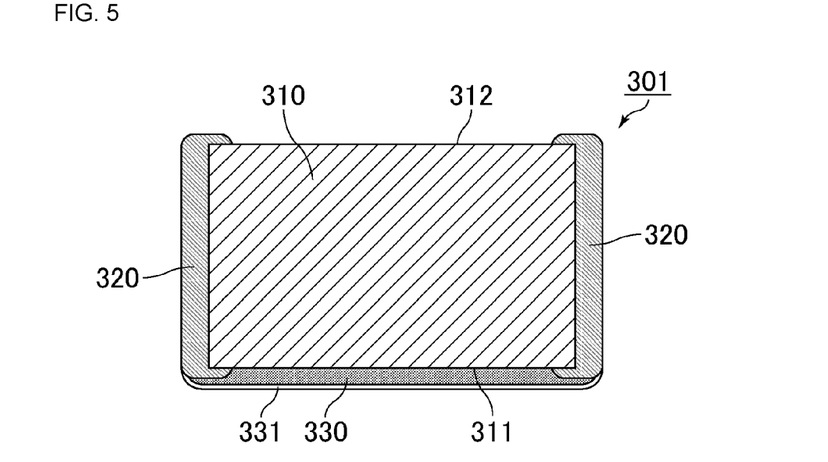
FIG. 5 is a sectional view schematically depicting another example of the electrode-equipped passive equipment.

FIG. 5 is a sectional view schematically depicting another example of the electrode-equipped passive equipment.

FIG. 5 depicts a multilayer ceramic capacitor as a chip component.

An electrode-equipped passive component 301 includes a multilayer body 310 corresponding to a passive component main body, an outer electrode 320 formed on the multilayer body 310, and an underfill layer 330.

The outer electrode 320 corresponds to an electrode of the electrode-equipped passive component.

As the outer electrode, any electrode can be used, such as a resin electrode, baked electrode, or plated electrode.

It is preferable that a layer of a material which dissolves by reflow, for example, a Sn-plated layer, is provided on a surface of the outer electrode.

The multilayer body 310 includes a first principal surface 311 of the multilayer body serving as a mount surface and a second principal surface 312 opposite to the mount surface. The multilayer body has an inner electrode layer and a dielectric ceramic layer not depicted, and the inner electrode layer has its one end electrically connected to the outer electrode.

The underfill layer 330 is provided on the first principal surface 311 of the multilayer body, and covers the outer electrode 320 on the first principal surface 311. The underfill layer 330 has a surface having a skin layer 331.

Regarding also this electrode-equipped passive component, with the temperature of the mount target being heated in advance at 40° C. or higher and the skin layer of the underfill layer being placed so as to be opposed to the mount target, the passive component and the mount target are adhered to each other to such an extent that the position of the passive component does not move on the mount target.

Then, the outer electrode of the passive component can be jointed to the mount target by reflow.

Also, the components of the skin layer (the components of the underfill layer) are prevented from being attached to the pickup nozzle.

EXAMPLES

As for the electrode-equipped passive component configured as depicted in FIG. 1, the characteristics of the composite configuring the underfill layer was changed for comparison.

Example 1

As a composite for underfill layer formation, a composite, in which the thermosetting resin contains a bisphenol-A-type epoxy resin, the flux contains adipic acid, and the solvent contains 1-(2-butoxy-1-methylethoxy)propan-2-ol, was prepared.

In the composite, the bisphenol-A-type epoxy resin is equal to or larger than 20 wt % and equal to or smaller than 30 wt % (i.e., from 20 wt % to 30 wt %) and the adipic acid is equal to or larger than 10 wt % and equal to or smaller than 20 wt % (i.e., from 10 wt % to 20 wt %).

The mount surface of a thin-film passive component main body was coated with the composite for underfill layer formation and was dried, thereby acquiring an electrode-equipped passive component.

The tack power of the skin layer of the underfill layer was measured at room temperature and 40° C. by using a tackiness tester (TAC1000 manufactured by RHESCA Co., Ltd.).

The tack power of the skin layer at room temperature was 25 mN/mm$^2$, and the tack power at 40° C. was 97 mN/mm$^2$.

When the manufactured electrode-equipped passive component was picked up by the pickup nozzle at room temperature, no stringiness to the pickup nozzle occurred.

Also, after the substrate was heated at 40° C. and the electrode-equipped passive component was placed on the substrate, reflow was performed.

A misalignment failure check was performed on more than one hundred electrode-equipped passive components, and the probability of occurrence of a misalignment failure was 0%.

Example 2

The type and composition of the solvent included in the composite for underfill layer formation were changed so that the tack power of the skin layer at 40° C. was 60 mN/mm$^2$. The tack power at room temperature is smaller than 13 mN/mm$^2$.

As with Example 1, when the manufactured electrode-equipped passive component was picked up by the pickup nozzle at room temperature, no stringiness to the pickup nozzle occurred.

Also, after the substrate was heated at 40° C. and the electrode-equipped passive component was placed on the substrate, reflow was performed. A misalignment failure check was performed on more than one hundred electrode-equipped passive components, and the probability of occurrence of a misalignment failure was 0%.

Comparative Example 1

The type and composition of the solvent included in the composite for underfill layer formation were changed so that the tack power of the skin layer at room temperature was 30 mN/mm$^2$. The tack power at 40° C. is equal to or larger than 60 mN/mm$^2$.

As with Example 1, when the manufactured electrode-equipped passive component was picked up by the pickup nozzle at room temperature, stringiness to the pickup nozzle occurred.

Also, after the substrate was heated at 40° C. and the electrode-equipped passive component was placed on the substrate, reflow was performed. A misalignment failure check was performed on more than one hundred electrode-equipped passive components, and the probability of occurrence of a misalignment failure was 0%.

Comparative Example 2

The type and composition of the solvent included in the composite for underfill layer formation were changed so that the tack power of the skin layer at 40° C. was 25 mN/mm$^2$. The tack power at room temperature is smaller than 13 mN/mm$^2$.

As with Example 1, when the manufactured electrode-equipped passive component was picked up by the pickup nozzle at room temperature, no stringiness to the pickup nozzle occurred.

Also, after the substrate was heated at 40° C. and the electrode-equipped passive component was placed on the substrate, reflow was performed. A misalignment failure check was performed on more than one hundred electrode-equipped passive components, and the probability of occurrence of a misalignment failure was 2.2%.

What is claimed is:

1. An electrode-equipped passive component to be mounted on a mount target, the electrode-equipped passive component comprising:
   a passive component main body;
   at least one electrode provided on a mount surface of the passive component main body; and
   an underfill layer provided on the mount surface of the passive component main body, wherein
   the underfill layer includes a thermosetting resin, a flux, and a solvent, and has a surface having a skin layer, and
   the skin layer has tack power equal to or smaller than 25 mN/mm$^2$ at room temperature and equal to or larger than 60 mN/mm$^2$ at 40° C.

2. The electrode-equipped passive component according to claim 1, wherein
   a plurality of the electrodes are provided, and
   the skin layer between the electrodes has a height higher than a height of the electrodes.

3. The electrode-equipped passive component according to claim 2, wherein
   the underfill layer has a thin thickness in an outer peripheral region of the underfill layer.

4. The electrode-equipped passive component according to claim 3, wherein
   an end face of the passive component main body has a laser modified layer.

5. A collective body of electrode-equipped passive components, the collective body comprising:
   a ring frame;
   a carrier tape laminated to the ring frame; and
   a plurality of the electrode-equipped passive components according to claim 4, collectively laminated so that the underfill layer is oriented to a surface opposite to the carrier tape.

6. A collective body of electrode-equipped passive components, the collective body comprising:
   a ring frame;
   a carrier tape laminated to the ring frame; and
   a plurality of the electrode-equipped passive components according to claim 3, collectively laminated so that the underfill layer is oriented to a surface opposite to the carrier tape.

7. The electrode-equipped passive component according to claim 2, wherein
   an end face of the passive component main body has a laser modified layer.

8. A collective body of electrode-equipped passive components, the collective body comprising:
   a ring frame;
   a carrier tape laminated to the ring frame; and
   a plurality of the electrode-equipped passive components according to claim 7, collectively laminated so that the underfill layer is oriented to a surface opposite to the carrier tape.

9. A collective body of electrode-equipped passive components, the collective body comprising:
   a ring frame;
   a carrier tape laminated to the ring frame; and
   a plurality of the electrode-equipped passive components according to claim 2, collectively laminated so that the underfill layer is oriented to a surface opposite to the carrier tape.

10. The electrode-equipped passive component according to claim 1, wherein
    the underfill layer has a thin thickness in an outer peripheral region of the underfill layer.

11. The electrode-equipped passive component according to claim 10, wherein
    an end face of the passive component main body has a laser modified layer.

12. A collective body of electrode-equipped passive components, the collective body comprising:
    a ring frame;
    a carrier tape laminated to the ring frame; and
    a plurality of the electrode-equipped passive components according to claim 11, collectively laminated so that the underfill layer is oriented to a surface opposite to the carrier tape.

13. A collective body of electrode-equipped passive components, the collective body comprising:
    a ring frame;
    a carrier tape laminated to the ring frame; and
    a plurality of the electrode-equipped passive components according to claim 10, collectively laminated so that the underfill layer is oriented to a surface opposite to the carrier tape.

14. The electrode-equipped passive component according to claim 1, wherein
an end face of the passive component main body has a laser modified layer.

15. A collective body of electrode-equipped passive components, the collective body comprising:
a ring frame;
a carrier tape laminated to the ring frame; and
a plurality of the electrode-equipped passive components according to claim 14, collectively laminated so that the underfill layer is oriented to a surface opposite to the carrier tape.

16. A collective body of electrode-equipped passive components, the collective body comprising:
a ring frame;
a carrier tape laminated to the ring frame; and
a plurality of the electrode-equipped passive components according to claim 1, collectively laminated so that the underfill layer is oriented to a surface opposite to the carrier tape.

* * * * *